Nov. 11, 1958

T. O. STANLEY 2,860,195

SEMI-CONDUCTOR AMPLIFIER CIRCUIT

Filed Sept. 7, 1955

INVENTOR.
Thomas O. Stanley
BY
H. O. Newton
ATTORNEY

United States Patent Office 2,860,195

Patented Nov. 11, 1958

2,860,195

SEMI-CONDUCTOR AMPLIFIER CIRCUIT

Thomas O. Stanley, Princeton, N. J., assignor to Radio Corporation of America, a corporation of Delaware Application September 7, 1955, Serial No. 532,825

6 Claims. (Cl. 179—171)

Figure 1:
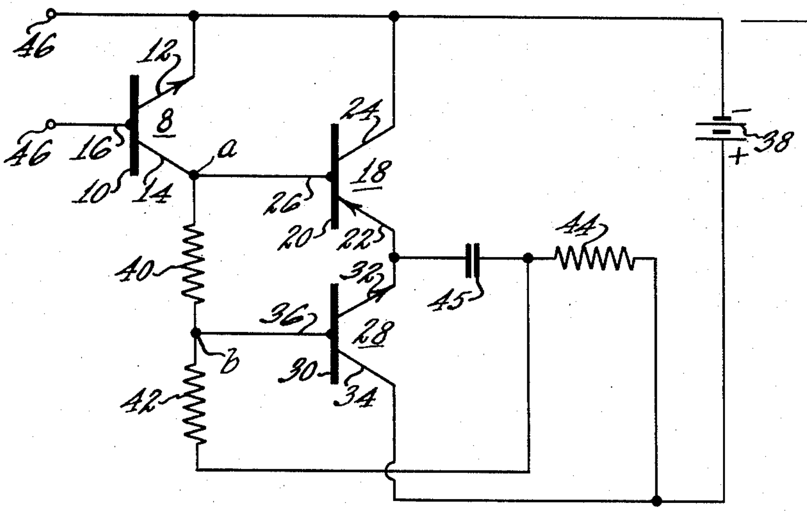

This invention relates in general to signal amplifier circuits which include an output stage having two signal paths arranged for push-pull operation and in particular to signal amplifier circuits of that type which utilize semi-conductor devices such as transistors as active signal amplifying elements.

It is well known that transistors of P type conductivity have symmetrical conduction characteristics when compared with transistors of N type conductivity. Thus N–P–N and P–N–P type junction transistors are referred to as being opposite conductivity or complementary symmetry types. The symmetrical properties of transistors, as referred to above, can be used for many different applications. For example, as the base current is changed in the same direction in an N–P–N and a P–N–P transistor respectively, the flow of emitter-collector current will increase in one transistor and decrease in the other transistor. Accordingly, if properly connected, a pair of opposite conductivity transistors will provide a push-pull output. This is achieved in general by connecting the transistors in parallel. That is, the corresponding input electrodes of the transistors are connected for signal conduction or amplification to one of the terminals of an input circuit and corresponding output electrodes of the transistors are connected to one of the terminals of an output circuit. One electrode of each transistor may be common to the input and output circuits. If appropriate bias voltages are applied to the electrodes of the transistors, their symmetrical properties are such as to produce an opposite output effect from a given input condition. Accordingly, push-pull amplification is possible, and an amplified single-ended output signal may be derived directly from a single-ended input signal. Such an effect is not possible with conventional electron-tube circuits.

The circuit connections for complementary symmetry push-pull amplifiers may assume several different specific forms, depending on the application and particular operating characteristics desired. One known way of connecting such an ampliffer is to couple the signal input circuit with the respective base electrodes which are, in turn, connected together. The emitter or output electrodes of the push-pull transistors are connected in common and a load device or utilization means is connected between the emitters and a source of fixed reference potential or ground for the system. The respective collectors are returned to either the positive or negative terminal of the power supply such as a pair of biasing batteries. Such a circuit configuration may be referred to as a common collector complementary symmetry push-pull amplifier. The common collector complementary symmetry push-pull amplifier circuit is characterized by relatively simple circuit connections. Hence, a single-ended input signal may be applied to the input circuit and an amplified single-ended output signal may be taken from the load circuit. In addition, the voltage developed across the load appears at the input terminals which increases the input impedance of the amplifier circuit. A push-pull circuit of this type may be driven from a relatively low impedance source such as a common emitter transistor having a collector load resistor which has a relatively low resistance. This permits the maximum undistorted voltage which is developed at the input to approach, but never to equal, the voltage that could be developed by an unloaded driving source. Furthermore, such a circuit affords signal degeneration which reduces signals distortion. While possessing these as well as other advantages, such a circuit may be characterized by relatively inefficient driver current coupling which increases the power requirements of the driver.

For these as well as other reasons and advantages of this type of push-pull circuit, it is often preferred as the signal output stage of a radio signal receiver where it is biased for class B operation. For such an application, the chief power drain on the power supply becomes the input power requirements of the driver. Accordingly, a comprise is required between the maximum undistorted voltage which is developed and the efficiency of coupling. In order to provide stable static operating conditions for a common collector complementary symmetry push-pull amplifier, a low impedance biasing network should be provided for the push-pull transistors. In addition, a direct-current return path must be provided for the driving source. A threshold bias for the push-pull transistors should also be established which is either stable with temperature variations or varies suitably with temperature changes. While stabilizing the operating point of such a circuit, the use of a low impedance biasing network in combination with the high input impedance of the push-pull stage may reduce the efficiency of the circuit. Ideally such a circuit should be characterized by both stable and efficient operation and it is, accordingly, an object of the present invention to provide an improved semiconductor signal translating circuit of the push-pull type which, with simplified circuit configuration and components, is characterized by stable operation and highly efficient signal coupling.

It is another object of the present invention to provide an improved push-pull signal amplifier circuit which utilizes opposite conductivity transistors as active amplifying elements and a transistor driving stage therefor connected for highly stable and efficient operation.

It is a still further object of the present invention to provide an improved transistor push-pull amplifier circuit, including a transistor driving stage for providing stable operation and which is characterized by efficient coupling of driver signal current to the push-pull stage.

It is yet another object of the present invention to provide an improved semi-conductor amplifying circuit of the push-pull type utilizing transistors of opposite conductivity types connected to provide more effective utilization of signal energy.

These and further objects and advantages of the present invention are achieved in a common collector complementary symmetry push-pull transistor amplifier in which the emitter or output electrodes are capacitively coupled to the load. Furthermore, the collector electrode of a driver transistor, which is connected in the common emitter configuration, may be directly connected with the base of one of the push-pull transistors, the base electrodes of which are connected together through a resistor. A collector coupling resistor for the driver transistor is connected in series with the aforementioned resistor and with the high voltage end of the load, which in turn is connected with the biasing supply source. With such a circuit, highly efficient utilization of the available signal energy is provided without an increase in battery drain or a decrease in power gain of the circuit.

Figures 1A, 2:
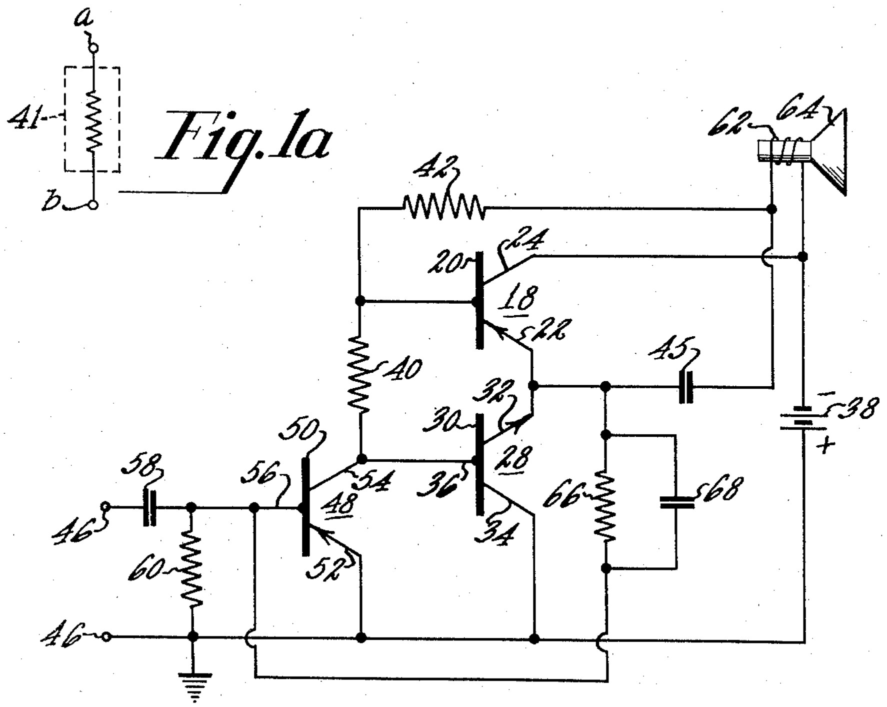

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figures 1 and 2 are schematic circuit diagrams of signal amplifying circuits utilizing complementary symmetry transistor output stages and transistor driver stages embodying the present invention.

Referring now to the drawing wherein like parts are indicated by like reference numerals in both figures and referring particularly to Figure 1, the output stage of, for example, a signal receiver comprises a first transistor amplifier or driver 8, and a pair of push-pull transistors 18 and 28. Each of the transistors may be considered to be of the junction type and comprises a semi-conductive body having three contacting electrodes. Thus, the transistor 8 has a semi-conductive body 10 and three electrodes which are an emitter 12, a collector 14 and a base 16. In the same manner, each of the push-pull output transistors 18 and 28 has a semi-conductive body 20 and 30 and three contacting electrodes which have been designated as emitters 22 and 32, collectors 24 and 34 and bases 26 and 36 respectively. As shown, the first transistor amplifier or driver 8 is of the N–P–N junction type. Transistor 18 of the push-pull stage is of the P–N–P type. Consequently, transistor 28 is of the N–P–N type. It should be understood that the specific conductivity of the transistors used is not critical so long as the biasing and conductivity between stages is correct. Furthermore, it should be noted that the invention is in no way limited to junction transistors. Other transistors such as N and P conductivity type point-contact transistors or other devices which have operating characteristics which are complementary and symmetrical may be used.

Proper biasing for the driver transistor 8 is obtained by connecting its common or emitter electrode 12 directly to the negative terminal of a source of direct-current operating voltage, such as illustrated by a biasing battery 38, and connecting its output or collector electrode 14 in accordance with one feature of the invention through three serially connected resistors, namely the resistors 40 and 42 and a load resistor 44 to the positive terminal of the biasing battery 38. The quiescent voltage at the collector 14 of the driver transistor 8 is normally adjusted to be approximately one-half the voltage of the supply battery 38. The collector coupling resistor 42 is selected to have a resistance slightly smaller than the product of the load resistance and the current gain of transistor 18. Further means, not shown, may be provided to establish proper biasing potentials on the base 36. As thus provided, the driver transistor 8 is biased for class A amplifying operation. The input circuit for the driver transistor 8 includes a pair of input terminals 46, one of which is connected with the emitter 12 and the other of which is connected directly with the base 16. Signal output current is derived from the collector 14 of the transistor 8, which is connected directly with the base 26 of the P–N–P transistor 18. Accordingly, the driver transistor 8 is of the so-called common emitter configuration, the emitter being common to the input and output circuits.

The base 26 of the transistor 18 is, in turn, connected through the resistor 40 to the base 36 of the other push-pull transistor amplifier 28. Thus, the output current from the driver transistor flows through the resistor 40 and develops a small initial differential forward bias for the bases 26 and 36 of the respective push-pull transistors. This resistor may have a resistance, by way of example, of 56 ohms. The value is chosen, in any particular instance and for a given set of transistors to minimize cross-over distortion in the push-pull output stage over the operating temperature range, and at the same time to keep the static current in the push-pull transistors at a relatively small value. By substituting a temperature sensitive impedance means for the resistor 40, such as the thermistor 41 (Figure 1*a*), the temperature range over which the circuit will operate acceptably may be extended.

The output circuit for the push-pull stage includes the two emitters 22, 32 of the respective push-pull output transistors 18 and 28 which are connected together as shown. The common emitters 22 and 32 are, in turn, coupled, in accordance with the invention, through a capacitor 45 to the load, illustrated as the resistor 44. The other end of the load resistor 44 is connected to the positive terminal of the biasing battery 38. Further biasing voltages for the push-pull output transistors 18 and 28 are obtained by connecting the collector 24 of the transistor 18 directly with the negative terminal of the biasing battery 38 and the collector 34 of the transistor 28 directly with the positive terminal of the biasing battery 38. In addition, the base 36 of the N–P–N push-pull transistor 28 is connected through the collector coupling resistors 42 and the load resistor 44 to the positive terminal of the biasing battery 38. As thus described, biasing for the push-pull output transistors 18 and 28 is seen to be proper for class B push-pull amplification action, although other classes of operation are possible. Furthermore, as described, the biasing network comprising the resistors 40 and 42 is seen to have a low impedance value which establishes a relatively stable operating point. In addition, the resistors 40 and 42 and the load resistor 44 provide a direct-current return path for the driver transistor 8.

In operation, a signal is applied to the input terminals 46 and accordingly, between the base 16 and the emitter 12 of the driver transistor 8. This signal is amplified to provide an amplified signal on the collector 14 of the driver transistor 8. This amplified signal is then applied to the base electrodes 26 and 36 of the output transistors 18 and 28, respectively. As was explained hereinbefore, the common emitters 22 and 32 of the output transistors are capacitively coupled through the capacitor 45 to the load resistor 44, which permits the connection, in accordance with the invention, of the collector coupling resistor 42 of the high voltage side of the load resistor 44. By providing such a connection, in accordance with the invention, efficient signal coupling is realized. If it is assumed that a positive half-cycle of signal voltage has been applied to the driver transistor 8 through the input terminals 46, this signal will be amplified and applied to the base electrodes 26 and 36 and the coupling resistor 42. The P–N–P transistor 18 will then begin to conduct heavily while the N–P–N transistor 28 will be non-conductive. Thus a voltage will be developed across the load resistor 44, making the voltage at the common emitters 22 and 32 of the output transistors more negative. On negative excursions of the input signal, on the other hand, the voltage developed across the load resistor 44 will tend to make the voltage at the common emitters 22 and 32 more positive. Since the coupling resistor 42 is connected between the bases 26 and 36 of the output transistors and the high voltage end of the load resistor 44, only the sum of the base to emitter voltages of the output transistors 18 and 28 and the signal developed across the coupling capacitor 45 appear across the coupling resistor 42. No output signal appears across the load coupling resistor 42. Thus this signal current through the coupling resistor 42 is maintained at a relatively small value by provision of the invention and the signal coupling efficiency is correspondingly increased.

As described, a circuit embodying the invention permits the development of an output peak-to-peak voltage which is nearly equal to the direct-current supply voltage. Furthermore, only one supply battery is needed and this battery need not be center-tapped. Accordingly, the problem of unbalanced battery drain is obviated and there is substantially no direct-current flow in the load. Since the emitters of the output transistors are capacitively coupled to the load, a shift in driver current does not produce unbalanced current flow but only a change in the static voltage at the output transistor emitters. Stable as well as highly efficient operation insuring full realization of the maximum undistorted voltage capabilities of the circuit, thus characterize the invention.

In Figure 2, reference to which is now made, the invention has been illustrated as being applied to the audio output stage of a radio signal receiving system. The driver stage in this embodiment of the invention comprises a transistor 48 of N type conductivity which may be considered to be a junction transistor of the P–N–P type. The transistor 48 includes a semi-conductive body 50, with which an emitter 52, a collector 54 and a base 56 are cooperatively associated. The input circuit for the transistor 48 includes the input terminals 46, to which may be applied an audio frequency signal such as that derived from the volume control of the receiver, for example. One of the terminals 46 is grounded while the remaining terminal 46 is coupled through a coupling capacitor 58 to the base 56. A biasing resistor 60 is connected between the base 56 and ground and the emitter 52 is returned to ground.

The collector 54 of the driver transistor 48, from which an amplified output signal is derived, is connected to the N–P–N output transistor 28 which is of an opposite conductivity type relative to the driver transistor 48 as well as the other output transistor 18. The circuit connections for the output transistors 18 and 28 are otherwise identical to the circuit illustrated in Figure 1, as are the connections from the driver transistor to the output transistors 18 and 28. In the circuit illustrated in Figure 2, the collector coupling resistor 42 is connected to the high voltage end of the voice coil 62 of a speaker 64, the voice coil 62 thereby serving as the circuit load. The other end of the voice coil 62 is returned to the negative terminal of the biasing battery 38. To provide additional stabilization for the circuit with, for example, variations in temperature, the common emitters 22 and 32 of the output transistors are coupled through an RC network comprising a resistor 66 and a capacitor 68 to the base 56 of the driver transistor 48, thus providing signal and direct current feedback from the output stage to the input stage.

In operation, the circuit illustrated in Figure 2 is substantially similar to the circuit illustrated in Figure 1, except that the polarities of the various voltages would be reversed. In addition, the circuit illustrated in Figure 2 has advantages similar or identical to those pointed out for the circuit of Figure 1.

While it will be understood that the circuit specifications may vary according to the design for any particular application, the following circuit specifications are included for the circuit of Figure 2, by way of example only:

| | |
|---|---|
| Resistors **40**, **42**, **60** and **66** | 56, 560, 2700 and 22,000 ohms respectively. |
| Capacitors **45**, **58** and **68** | 50, 1 and .005 microfarads respectively. |
| Battery **38** | 6 volts. |
| Coil **62** | 12 ohm voice coil. |

With circuit components of these values, the amplifier circuit embodying the invention will provide a nominal 150 milliwatt output for 85 microamperes (R. M. S.) input. The total quiescent current drain was found to be approximately 8 milliamperes.

As described herein, an improved semi-conductor signal amplifier circuit provides highly efficient signal coupling together with relatively stable and distortion-free operation. Moreover, the circuit connections are simple and relatively few circuit components are needed. Thus the circuits may find wide use in systems wherever economy and reliability are required.

What is claimed is:

1. A signal amplifying circuit adapted for operation as the power output stage of signal receivers and the like comprising, in combination, a driver transistor having a base, a collector and an emitter electrode, input circuit means for applying an input signal between the base and emitter electrodes of said driver transistor, a pair of push-pull output transistors of opposite conductivity types each having a base, a collector and an emitter electrode, direct current conductive means connecting the collector of said driver transistor with the base electrode of one of said output transistors, a first resistor connected between the base electrodes of said output transistors, means connecting the emitter electrodes of said output transistors in common, a capacitor connected with the emitter electrodes of said output transistors, a direct-current conductive load impedance element serially connected between said capacitor and the collector electrode of the other of said output transistors, means providing biasing potentials for said transistors serially connected between the collector electrodes of said output transistors, and means providing operating bias for the collector electrode of said driver transistor and efficient signal coupling between said driver transistor and said output transistors including a second resistor connected between the base electrode of the other of said output transistors and the junction of said capacitor and said load impedance element.

2. A signal amplifying circuit adapted for operation as the power output stage of signal receivers and the like comprising, in combination, a driver transistor of one conductivity type having a base, a collector and an emitter electrode, input circuit means for applying an input signal between the base and emitter electrodes of said driver transistor, a first output transistor of an opposite conductivity type having a base, an emitter and a collector electrode, a second output transistor of the same conductivity type as said driver transistor and having a base, an emitter and a collector electrode, direct current conductive means connecting the collector of said driver transistor with the base electrode of said first output transistor, a first resistor connected between the base electrodes of said first and second output transistors, means directly connecting the emitter electrode of said first output transistor with the emitter electrode of said second output transistor, a capacitor connected with the emitter electrodes of said first and second output transistors, a direct-current conductive load impedance element serially connected between said capacitor and the collector electrode of said second output transistor, means providing biasing potentials for said transistors to bias said output transistors for class B push-pull operation serially connected between the collector electrodes of said first and second output transistors, and means providing operating bias for the collector electrode of said driver transistor and efficient signal coupling between said driver transistor and said output transistors including a second resistor connected between the base electrode of said second output transistor and the junction of said capacitor and said load impedance element.

3. A signal amplifying circuit comprising, in combination, a driver transistor having a base, a collector and an emitter electrode, means for applying an input signal between the base and emitter electrodes of said driver transistor, a pair of push-pull output transistors of opposite conductivity types each having a base, a collector and an emitter electrode, direct current conductive means connecting the collector of said driver transistor with the base electrode of one of said output transistors, conductive circuit means connecting the base electrode of one of said output transistors with the base electrode of the other of said output transistors, means connecting the emitter electrodes of said output transistors in common, a capacitor connected with the emitter electrodes of said output transistors, a direct-current conductive load impedance element connected with said capacitor, means providing biasing potentials for said transistors including a direct-current supply source connected between the collector electrodes of said output transistors and with said load impedance element, and means providing operating bias for the collector electrode of said driver transistor and efficient signal coupling between said driver transistor and said output transistors including a resistor connected between the base electrode of the other of said output transistors and the junction of said capacitor and said load impedance element.

4. A signal amplifier circuit comprising, in combination, a pair of transistors of opposite conductivity types each having emitter, collector and base electrodes, a driver transistor for said pair of transistors including a base input, a collector output and a common emitter electrode and operative to simultaneously apply an input signal to the base electrodes of said pair of transistors, means providing an output circuit including direct-current conductive load means for said amplifier, a capacitor connected between said load means and the emitter electrodes of said pair of transistors, means providing energizing potentials connected with the collector electrodes of said pair of transistors and with said load means, conductive circuit means connected between the base electrodes of said pair of transistors, a resistor connected with the junction of said capacitor and said load means, and means connecting the collector electrode of said driver transistor, said conductive circuit means, said resistor and said load in series in the order named to provide efficient signal coupling between said driver transistor and said pair of transistors.

5. A signal amplifier adapted for operation as the signal output circuit of signal receivers and the like comprising, in combination, a pair of semi-conductor devices of opposite conductivity types each having emitter, collector and base electrodes, semi-conductor driving means for said pair of devices and operative to simultaneously apply an input signal in parallel to each of said base electrodes, means providing a source of energizing potential having a pair of terminals one of which is connected with the collector electrode of one of said devices and the other of which is connected to the collector electrode of the other of said devices, means providing an output circuit including direct-current conductive load means capacitively coupled at one end to said emitter electrodes and connected at the other end to said one terminal of said source, direct-current conductive circuit means connected between said base electrodes, means connecting said driving means with said conductive circuit means for applying input signals in parallel to said base electrodes, and means providing operating bias for said driving means and efficient signal coupling between said driving means and said pair of semi-conductor devices including a resistive impedance element connected between said conductive circuit means and said one end of said load means.

6. In a push-pull signal amplifying circuit, the combination with a first and a second semi-conductor device of opposite conductivity types, each of said devices including emitter, collector and base electrodes, of means for applying signals to the base electrodes of said pair of devices in parallel including a third semi-conductor device of an opposite conductivity type to said first semi-conductor device and including a collector output electrode, a first resistive element connected between the base electrodes of said first and second devices, means connecting the emitter electrode of said first device with the emitter electrode of said second device, means providing a direct-current conductive output circuit coupled by a capacitor to the emitter electrodes of said first and second devices for deriving an output signal therefrom, means providing a direct-current supply source connected between the collector electrodes of said first and second devices and with said output circuit, and means connecting the collector of said third device, said resistive element, and said output circuit in series with said supply source to provide operating bias for said third device and efficient signal coupling between said third device and said first and second devices including a second resistive element connected between said first resistive element and the junction of said capacitor and said output circuit.

References Cited in the file of this patent

UNITED STATES PATENTS

| | | |
|---|---|---|
| 2,666,819 | Raisbeck | Jan. 19, 1954 |
| 2,789,164 | Stanley | Apr. 16, 1957 |

OTHER REFERENCES

Lohman article, Electronics, Sept. 1953, pp. 140–143.

Sziklai article, Electronic Engineering for Sept. 1953, pp. 358–364.